United States Patent
Gonzalez et al.

(10) Patent No.: US 6,756,858 B2
(45) Date of Patent: Jun. 29, 2004

(54) CONDUCTIVE PATH COMPENSATION FOR MATCHING OUTPUT DRIVER IMPEDANCE

(75) Inventors: Jason Gonzalez, Ft Collins, CO (US); M. Jason Welch, Ft. Collins, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 200 days.

(21) Appl. No.: 10/015,350

(22) Filed: Dec. 12, 2001

(65) Prior Publication Data

US 2003/0107449 A1 Jun. 12, 2003

(51) Int. Cl.[7] .................................................. H03H 7/40
(52) U.S. Cl. ........................ 333/17.3; 327/362; 326/30
(58) Field of Search .................... 333/17.3, 32; 326/30; 327/362

(56) References Cited

U.S. PATENT DOCUMENTS

| | | | | |
|---|---|---|---|---|
| 5,194,765 A | * | 3/1993 | Dunlop et al. | 307/443 |
| 5,459,440 A | * | 10/1995 | Claridge et al. | 333/17.3 |
| 6,486,612 B2 | * | 11/2002 | Fujimura et al. | 315/225 |
| 6,545,522 B2 | * | 4/2003 | Mughal et al. | 327/334 |

OTHER PUBLICATIONS

Hayt et al., Engineering Circuit Analysis, 1978, McGraw–Hill Book Company, 3rd Edition, p. 68.*

* cited by examiner

*Primary Examiner*—Benny Lee
*Assistant Examiner*—Stephen E. Jones

(57) ABSTRACT

A method for matching output impedance of a driver to a load impedance. In representative embodiments an external impedance is attached between an external contact and a first source potential, wherein the load impedance includes the external impedance plus impedance of interconnections between an output terminal of the driver and the external impedance. An adjustable impedance, which can be field effect transistors which can be turned on separately and in combination to change the value of the adjustable impedance and which can be located on an integrated circuit, are connected between a second source potential and the output terminal of the driver. A reference potential, wherein the reference potential has a value half-way between the first source potential and the second source potential is obtained. And a load matching impedance is obtained by changing the adjustable impedance until the absolute value of the difference between the voltage of the output terminal of the driver and the reference potential is less than a preselected value.

8 Claims, 7 Drawing Sheets

CONDUCTIVE PATH COMPENSATION FOR MATCHING OUTPUT DRIVER IMPEDANCE

FIELD OF THE INVENTION

The present invention relates generally to integrated circuits, and, more particularly, to output drivers, and even more particularly to output impedance matching.

BACKGROUND OF THE INVENTION

As the number and complexity of computations and other functions performed by integrated circuit (IC) chips has increased, so has the speed required to effectively make these computations. For the clock rates at which modern integrated circuits operate, metal traces on the IC take on characteristics common to transmission lines. In order to maintain signal quality, it is necessary to minimize reflections and signal distortions which requires matching the output impedance of the signal source to that of the line.

The more functions the IC chip contains, the larger the number of circuit blocks which it typically has in order to communicate with other devices external to the IC. The circuit blocks that provide this interface function between the core functions of the IC and the outside world are referred to as input/output (I/O) PAD's. PAD blocks typically contain drivers for obtaining signals from other chip circuitry and driving them out of the chip and receivers for receiving signals from external devices and propagating those signals to other chip circuitry.

Contact between an integrated circuit and the outside world typically takes place through contact areas located near the outside edge of the chip. The denser chip circuitry is placed in locations removed from these contact areas, as stress produced during I/C contact formation is severe enough to cause damage to any circuitry that might be lying close to those contacts. In addition, damage produced in breaking the chips apart prior to packaging makes the peripherical chip area unsuitable for chip circuitry and thus available for chip contacts with their wider spacing.

The integrated circuit then will typically have its inner area devoted to active circuitry and its periphery area populated with chip contact areas, Relatively long conducting traces interconnect these two area. These traces then move the contact points to the active circuit areas of the integrated circuit from the inner areas of the chip to the outer areas where the contact to the outside world is created. This outer conducting layer then is often referred to as the redistribution metal layer, as it redistributes the output points from the input/output circuit blocks to points on the periphery of the IC. In common applications of the popular flip-chip technology, solder bumps bonded to the chip contact areas are bonded to traces in packages which are then mounted on printed circuit boards for interconnect to other integrated circuits and other devices.

Due to the fast clocking rates required in modem integrated circuits and the relatively long traces between chip circuitry and the chip contact areas, the resistance of these redistribution traces becomes significant. Of significance also are the differences between the various redistribution traces. As such, one chip contact area presents a different output impedance than does another. Such mismatches can degrade the speed at which a chip can reliably function. Minimizing these mismatches is a design objective, but one that often falls short. Processing variations add a further complicating variable which cannot be completely designed around. Thus, there is a need for a means to more effectively match the output impedance of integrated circuit I/O PAD's to the impedance of the lines which those input/output devices are driving.

SUMMARY OF THE INVENTION

Representative embodiments of a method for matching output impedance of a driver to a load impedance are disclosed. An external impedance is attached between an external contact and a first source potential, wherein the load impedance includes the external impedance plus impedance of interconnections between an output terminal of the driver and the external impedance. An adjustable impedance, which can be field effect transistors which can be turned on separately and in combination to change the value of the adjustable impedance and which can be located on an integrated circuit, are connected between a second source potential and the output terminal of the driver. A reference potential, wherein the reference potential has a value halfway between the first source potential and the second source potential is obtained. And a load matching impedance is obtained by changing the adjustable impedance until the absolute value of the difference between the voltage of the output terminal of the driver and the reference potential is less than a preselected value.

Other aspects and advantages of the present invention will become apparent from the following detailed description, taken in conjunction with the accompanying drawings, illustrating by way of example the principles of the invention.

BRIEF DESCRIPTION OF THE DRAWINGS

The accompanying drawings provide visual representations which will be used to more fully describe the invention and can be used by those skilled in the art to better understand it and its inherent advantages. In these drawings, like reference numerals identify corresponding elements and.

DETAILED DESCRIPTION OF THE PREFERRED EMBODIMENTS

Figure 1A:
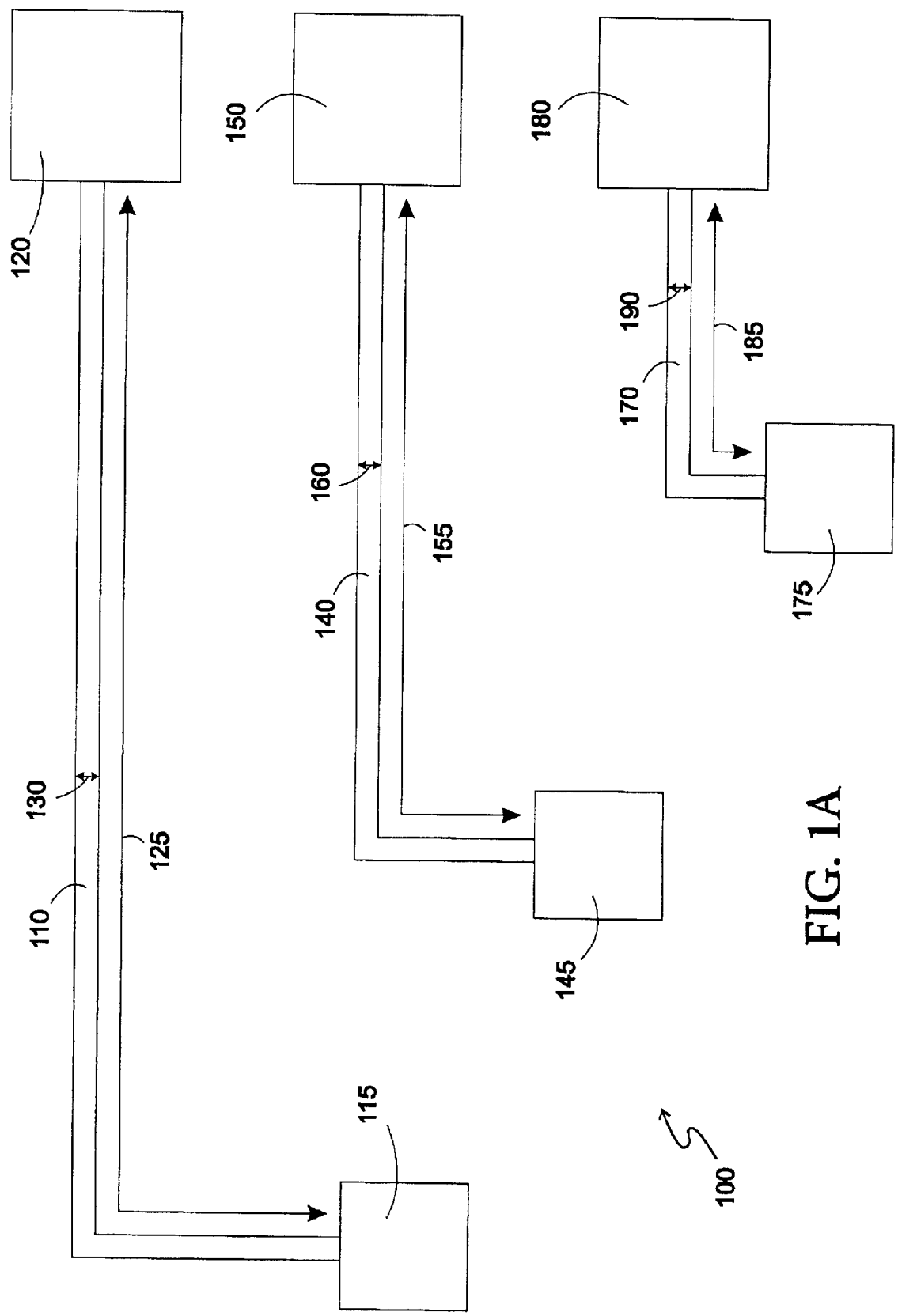
FIG. 1A is a drawing of a part of an integrated circuit as described in various representative embodiments consistent with the teachings of the invention.

As shown in the drawings for purposes of illustration, the present patent document relates to novel techniques for matching the output impedance of input/output circuits on integrated circuits to that of the lines which they are driving. In the following detailed description and in the several figures of the drawings, like elements are identified with like reference numerals.

FIG. 1A is a drawing of a part of an integrated circuit 100 as described in various representative embodiments consistent with the teachings of the invention. The integrated circuit 100 is also referred to herein as the chip 100. In FIG. 1A, a first, second, and third input/output circuits 115,145, 175 are connected respectively to a first, second, and third chip interconnect areas 120,150,180 via respectively a first, second, and third conducting traces 110,140,170. The resistances of the conducting traces 110,140,170 are expressed by $(\rho*l)/(w*h)$, where $\rho$ is the resistivity of the conducting layer and where l, w, and h are respectively the length, width, and height of the conducting traces. First conducting trace 110 has a first length 125 and a first width 130. Second conducting trace 140 has a second length 155 and a second width 160. Third conducting trace 170 has a third length 185 and a third width 190. In the example of FIG. 1A, the second conducting trace 140 is approximately twice as long as that of the third conducting trace 170, and the first conducting trace 110 is approximately three times as long as that of the third conducting trace 170. Since first, second, and third width 130,160,190 are equal and assuming that the resistivities and thicknesses of first, second, and third conducting traces 110,140,170 are equal, the resistance of the second conducting trace 140 is approximately twice that of the third conducting trace 170, and the resistance of the first conducting trace 110 is approximately three times that of the third conducting trace 170. Thus, the impedances that the first, second, and third input/output circuits 115,145,175 drive can differ significantly.

Figure 1B:
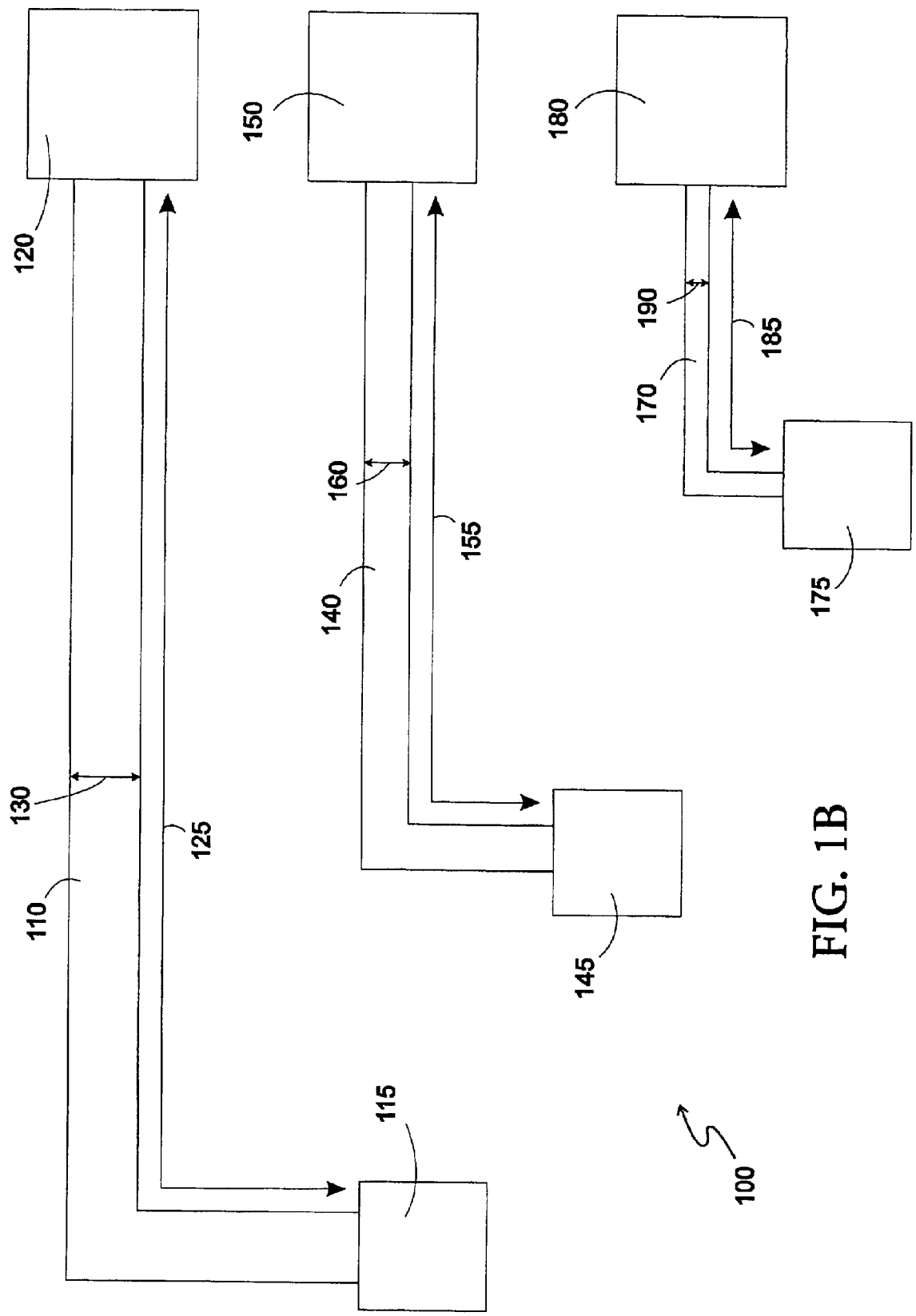
FIG. 1B is a drawing of a part of another integrated circuit as described in various representative embodiments consistent with the teachings of the invention.

FIG. 1B is a drawing of a part of another integrated circuit 100 as described in various representative embodiments consistent with the teachings of the invention. Once again, the first, second, and third input/output circuits 115,145,175 are connected respectively to the first, second, and third chip interconnect areas 120,150,180 via respectively the first, second, and third conducting traces 110,140,170. Also, in the example of FIG. 1B, the second conducting trace length 155 is approximately twice that of the third conducting trace length 185, and the first conducting trace length 125 is approximately three times that of the third conducting trace length 185. However, in the example of FIG. 1B, the second conducting trace width 160 is approximately twice that of the third conducting trace width 190, and the first conducting trace width 130 is approximately three times that of the third conducting trace width 190. Thus, the length ratios for first, second, and third conducting traces 110,140,170 of 3:2:1 are offset by the width ratios for first, second, and third conducting traces 110,140,170 of 1:2:3 with the result that first, second, and third conducting traces 110,140,170 all have the same resistance.

Figure 2A:
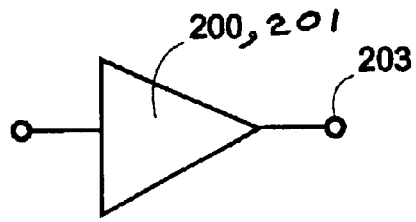
FIG. 2A is a drawing of a driver as described in various representative embodiments consistent with the teachings of the invention.
Figure 2B:
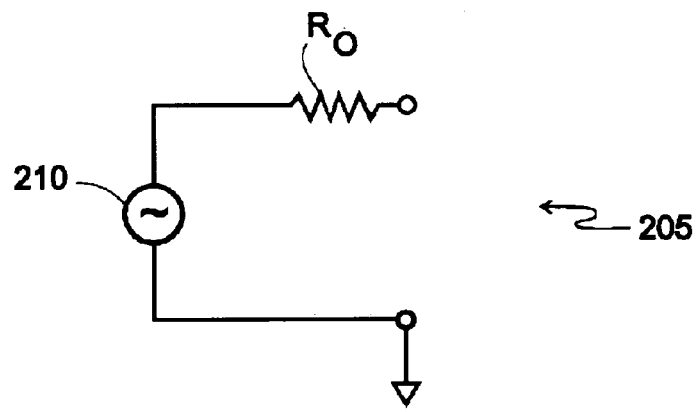
FIG. 2B is a drawing of a driver equivalent circuit as described in various representative embodiments consistent with the teachings of the invention.
Figure 2C:
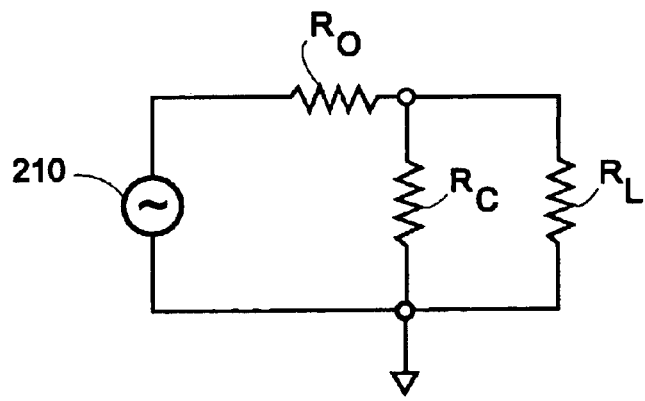
FIG. 2C is another drawing of the driver equivalent circuit as described in various representative embodiments consistent with the teachings of the invention.

FIG. 2A is a drawing of a driver 200 as described in various representative embodiments consistent with the teachings of the invention. The driver 200 has an output terminal 203. FIG. 2B is a drawing of a driver equivalent circuit 205 as described in various representative embodiments consistent with the teachings of the invention. The driver equivalent circuit 205 of FIG. 2B is a Thevenin equivalent circuit of that shown in FIG. 2A comprising a driver source 210 and an output impedance $R_O$. FIG. 2C is another drawing of the driver equivalent circuit 205 as described in various representative embodiments consistent with the teachings of the invention. The driver equivalent circuit 205 of FIG. 2C is the Thevenin equivalent circuit shown in FIG. 2B with the addition of a load matching impedance $R_C$, wherein the combination of the output impedance $R_O$ of the driver and the load matching impedance $R_C$ matches a load impedance $R_L$.

In other representative embodiments, other drivers 200 are connected to one or more of the other conducting traces 140,170 at one of the other input/output circuits 145,175. These other drivers 200 are referred to herein as additional drivers 201.

Figure 3A:
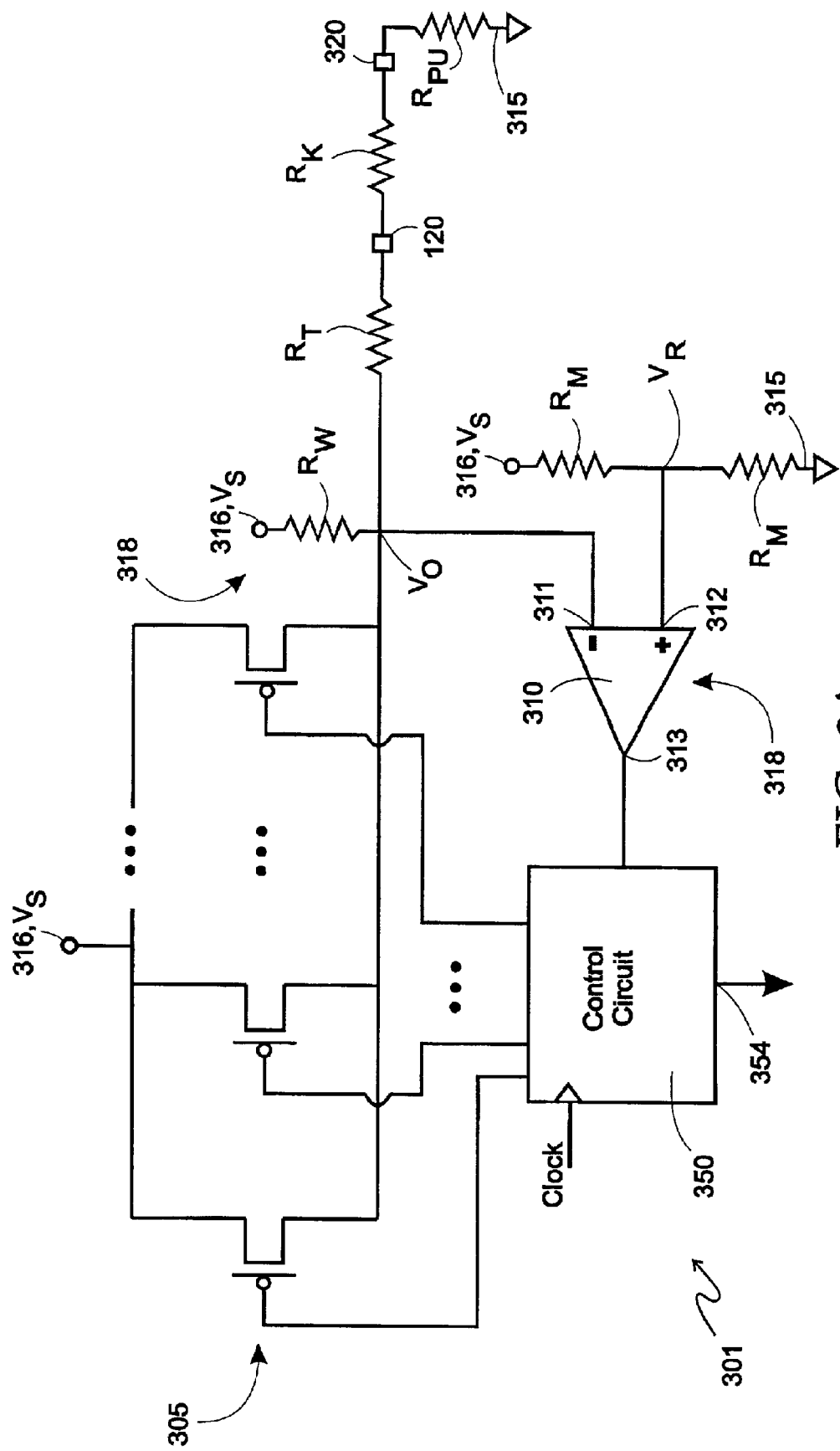
FIG. 3A is a drawing of a circuit for matching output impedance as described in various representative embodiments consistent with the teachings of the invention.

FIG. 3A is a drawing of a circuit for matching output impedance as described in various representative embodiments consistent with the teachings of the invention. In FIG. 3A, a series of pull-up transistors 305, which in this example are p-channel metal-oxide-semiconductor field effect transistors 305, are connected in a pull-up impedance matching circuit 301 to the conducting trace 110 having trace resistance $R_T$ and to a first comparator input 311 of a comparator 310. An output potential $V_O$ is the potential of the output of the input/output circuit 115 at its connection to the conducting trace 110. Source contacts of the pull-up transistors 305 are connected to a second source potential 316 which for the example of FIG. 3A is supply potential $V_s$. Drain contacts of the pull-up transistors 305 are connected to the output of the input/output circuit 115. A second comparator input 312 is connected between a pair of matched resistors $R_M$. The remaining contact of one of the matched resistors $R_M$ is connected to the second source potential 316 which again for FIG. 3A is supply potential $V_s$, and the remaining contact of the other matched resistor $R_M$ is attached to a first source potential 315 which for the example of FIG. 3A is ground potential. Thus, the potential at the second comparator input 312 is reference potential $V_R=V_s/2$. The combination of the two matched resistors $R_M$ connected between first and second source potentials 315,316 form a reference potential source 317. The conducting trace 110 represented in FIG. 3A by trace resistance $R_T$ is connected at interconnect area 120 shown in FIG. 1A to other interconnects, as for example packaging and printed circuit board connections whose resistance is $R_K$. For the pull-up output impedance matching phase depicted in FIG. 3A, a first load resistor $R_{PU}$, also referred to herein as a pull-up resistor $R_{PU}$ which could be, for example, a 1% precision resistor, is located off-chip connected between $R_K$ at an external contact 320 and the first source potential 315 which again for the example of FIG. 3A is ground potential. The external contact 320 is preferably located on a printed circuit board on which the pull-up resistor $R_{PU}$ is mounted.

During the pull-up output impedance matching phase various pull-up transistors 305 are selected according to preselected rules and turned on. The impedance of the pull-up transistors 305 is compared to that of the total load impedance which for this example is $R_L=R_T+R_K+R_{PU}$, seen by the input/output circuit 115 via a comparison of the voltage as measured at the drain contacts of the pull-up transistors 305 by the comparator 310 at the first comparator input 311 with that at second comparator input 312. The result of this comparison, the value of a comparator output 313 of the comparator 310, is transferred to a control circuit 350. The control circuit 350 iteratively changes those pull-up transistors 305 that are turned-on until the impedance of the pull-up transistors 305 that are turned-on matches that of the total load impedance $R_L$ as evidenced by the equality of the potential at the first comparator input 311 and the potential at the second comparator input 312. The control circuit 350 then outputs that information via control-circuit output 354.

Should the pull-up resistor $R_{PU}$ be omitted, either inadvertently or intentionally, external contact 320 will be an open circuit. A means for detecting this open circuit at external contact 320 is represented in FIG. 3A as an open circuit detector circuit 318. The open circuit detector circuit 318 comprises a detector resistor $R_W$ and the comparator 310. The detector resistor $R_W$ is connected between the first comparator input 311 and supply potential $V_S$. The impedance of open circuit detector resistor $R_W$ is preferably much larger than the pull-up resistor $R_{PU}$. In open circuit detection mode, pull-up transistors 305 are off. If the external contact 320 is an open circuit, i.e., $R_{PU}$ is not connected between external contact 320 and ground, the output potential $V_O$ is close in value to that of supply potential $V_S$. Otherwise, if $R_{PU}$ is connected between external contact 320 and ground, the output potential $V_O$ is close in value to that of ground potential. The difference between these two conditions is detected by the comparator 310 and reported at comparator output 313 to the control circuit 350. If the external contact 320 is an open circuit, the control circuit 350 identifies and/or turns on as default a preselected combination of pull-up transistors 305.

Figure 3B:
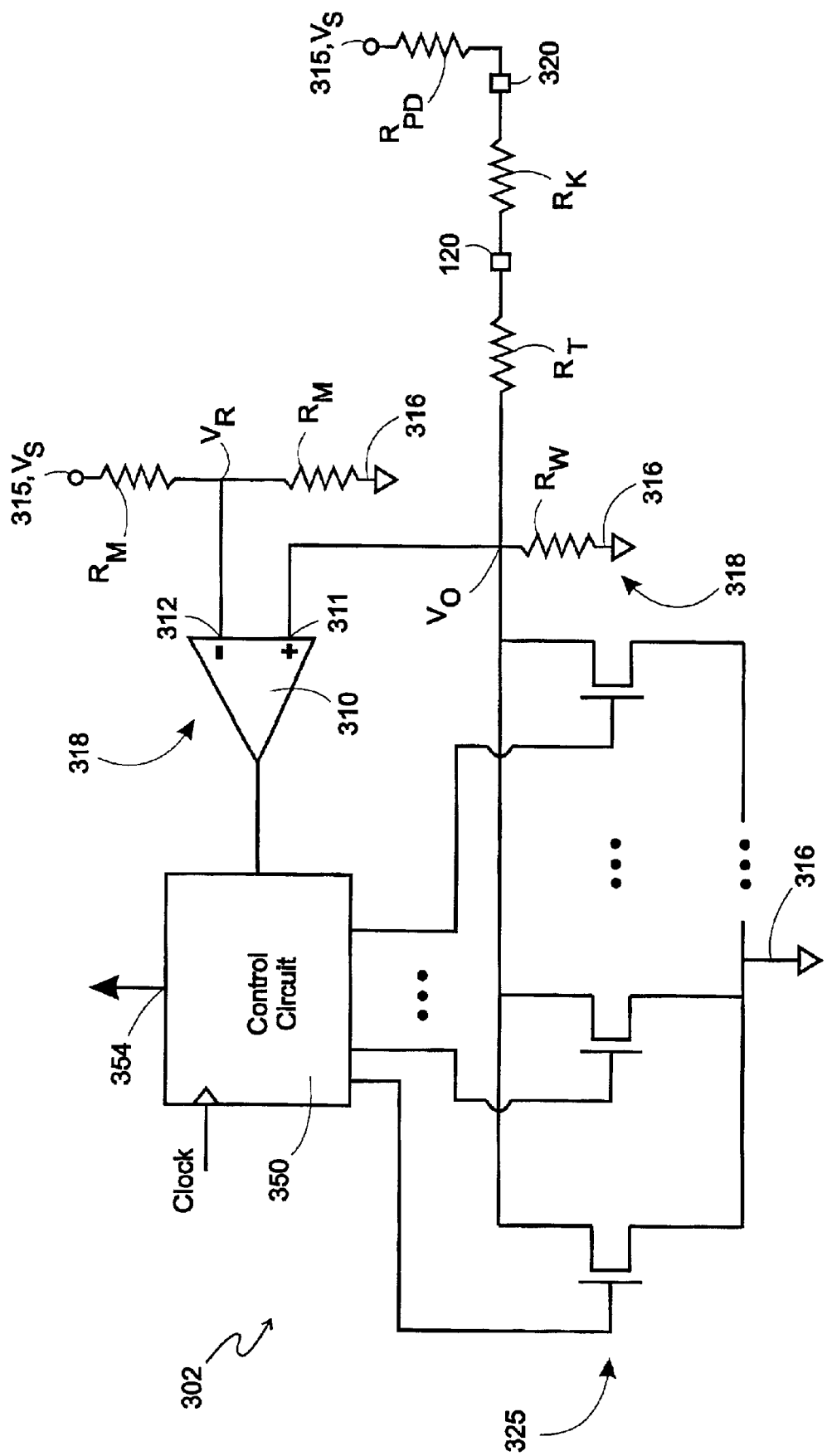
FIG. 3B is a drawing of another circuit for matching output impedance as described in various representative embodiments consistent with the teachings of the invention.

FIG. 3B is a drawing of another circuit for matching output impedance as described in various representative embodiments consistent with the teachings of the invention. In FIG. 3B, a series of pull-down transistors 325, which in this example are n-channel metal-oxide-semiconductor field effect transistors 325, are connected in a pull-down impedance matching circuit 302 to the conducting trace 110 having trace resistance $R_T$ and to the first comparator input 311 of the comparator 310. The output potential $V_O$ is the potential of the output of the input/output circuit 115 at its connection to the conducting trace 110. Drain contacts of the pull-down transistors 325 are connected to the second source potential 316 which for the example of FIG. 3B is ground potential. Source contacts of the pull-down transistors 325 are connected to the output of the input/output circuit 115. The second comparator input 312 is connected between the pair of matched resistors $R_M$. The remaining contact of one of the matched resistors $R_M$ is connected to the first source potential 315 which for the example of FIG. 3B is supply potential $V_s$, and the remaining contact of the other matched resistor $R_M$ is attached to the second source potential 316 which for this example is ground potential. Thus, as above the potential at the second comparator input 312 is reference potential $V_R = V_s/2$. Also, as above, the conducting trace 110 represented in FIG. 3B by trace resistance $R_T$ is connected at interconnect area 120 shown in FIG. 1A to other interconnects, as for example packaging and printed circuit board connections whose resistance is $R_K$. For the pull-down output impedance matching phase depicted in FIG. 3B, a second load resistor $R_{PD}$, also referred to herein as a pull-down resistor $R_{PD}$, which could be, for example, a 1% precision resistor, is located off-chip connected between $R_K$ at the external contact 320 and the first source potential 315 which for the example of FIG. 3B is $V_s$. The external contact 320 is preferably located on the printed circuit board on which the pull-down resistor $R_{PD}$ is mounted.

During the pull-down output impedance matching phase various pull-down transistors 325 are selected according to preselected rules and turned on. The impedance of the pull-down transistors 325 is compared to that of the total load impedance which for this example is $R_L = R_T + R_K + R_{PD}$, seen by the input/output circuit 115 via a comparison of the voltage as measured at the source contacts of the pull-down transistors 325 by the comparator 310 at the first comparator input 311 with that at second comparator input 312. The result of this comparison, the value of the comparator output 313 of the comparator 310, is transferred to the control circuit 350. The control circuit 350 iteratively changes those pull-down transistors 325 that are turned-on until the impedance of the pull-down transistors 325 that are turned-on matches that of the total load impedance $R_L$ as evidenced by the equality of the potential at the first comparator input 311 and the potential at the second comparator input 312. The control circuit 350 then outputs that information via control-circuit output 354.

Should the pull-down resistor $R_{PD}$ be omitted, either inadvertently or intentionally, external contact 320 will be an open circuit. A means for detecting this open circuit at external contact 320 is represented in FIG. 3B as the open circuit detector circuit 318. The open circuit detector circuit 318 comprises a detector resistor $R_W$ and the comparator 310. The detector resistor $R_W$ is connected between the first comparator input 311 and ground potential. The impedance of open circuit detector resistor $R_W$ is preferably much larger than the pull-down resistor $R_{PD}$. In open circuit detection mode, pull-down transistors 325 are off. If the external contact 320 is an open circuit, i.e., $R_{PD}$ is not connected between external contact 320 and supply potential $V_S$, the output potential $V_O$ is close in value to that of ground potential. Otherwise, if $R_{PD}$ is connected between external contact 320 and supply potential $V_S$, the output potential $V_O$ is close in value to that of supply potential $V_S$. The difference between these two conditions is detected by the comparator 310 and reported at comparator output 313 to the control circuit 350. If the external contact 320 is an open circuit, the control circuit 350 identifies and/or turns on as default a preselected combination of pull-down transistors 325.

Pull-up and pull-down resistors $R_{PU}$, $R_{PD}$ are individually referred to in a common sense as external impedance $R_{PU}$, $R_{PD}$. The pull-up transistors 305 and the pull-down transistors 325 are individually referred to in a common sense as the adjustable impedance 305,325 since the purpose of the pull-up and pull down transistors 305,325 is to provide an adjustable resistance.

Figure 4:
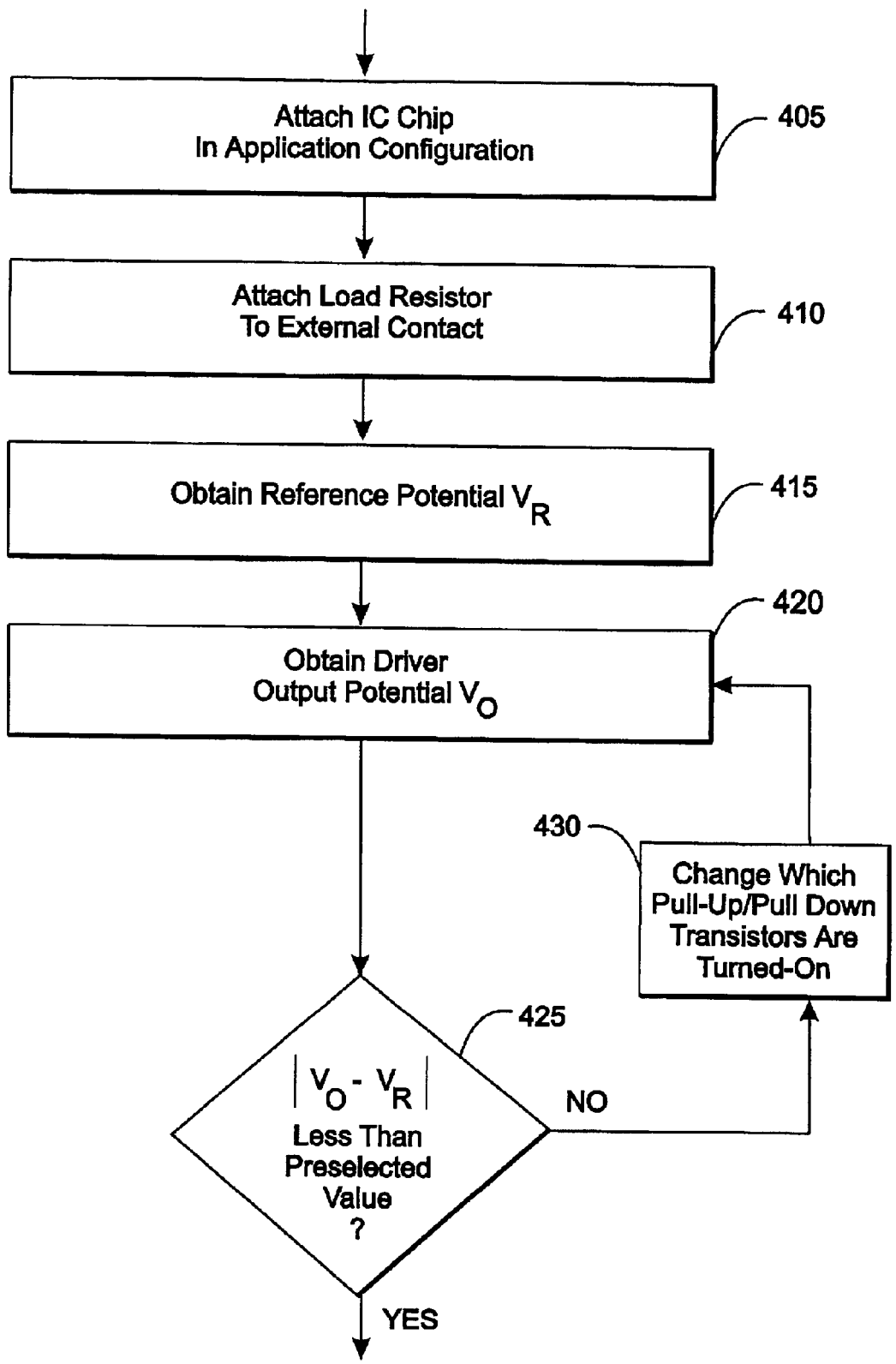
FIG. 4 is a drawing of a flow chart for matching output impedance as described in various representative embodiments consistent with the teachings of the invention.

FIG. 4 is a drawing of a flow chart 400 for matching output impedance as described in various representative embodiments consistent with the teachings of the invention. In block 405, the integrated circuit 100 is mounted in its application configuration. Block 405 then transfers control to block 410.

In block 410, either the first load resistor $R_{PU}$ for matching impedance in the pull-up mode or the second load resistor $R_{PD}$ for matching impedance in the pull-down mode is attached to the external contact 320. Block 410 then transfers control to block 415.

In block 415, the reference potential $V_R$ is obtained via the on-chip attachment of the mid-point of two matched resistors $R_M$ attached between the supply potential $V_S$ and ground potential at the second comparator input 312. Block 415 then transfers control to block 420.

In block 420, the voltage of the output terminal 203 of the driver 200, which is indicated herein as $V_O$, is obtained. Block 420 then transfers control to block 425.

When the absolute difference between the reference potential $V_R$ and the output potential $V_O$ is less than or equal to a preselected difference, block 425 terminates the process. Otherwise, block 425 transfers control to block 430.

In block 430, during the pull-up output impedance matching phase various pull-up transistors 305 are selected according to preselected rules and turned on. During the pull-down output impedance matching phase various pull-down transistors 325 are selected 110 according to preselected rules and turned on. Block 430 then transfers control to block 420.

Depending upon which output impedance match condition, pull-up or pull-down, was performed, the other is preferably performed by repeating the above process beginning at block 410 to obtain the other condition, pull-up or pull-down, output impedance match.

In an alternative embodiment, the pull-up transistors 305 and pull-down transistors 325 are binary weighted and begin in their "off" state. They are then turned on one at a time from the most significant bit to the least significant bit. The comparator 310 resolves the difference between the reference potential $V_R$ and the output potential $V_O$, but this difference eventually becomes less than one least significant bit.

Figure 5:
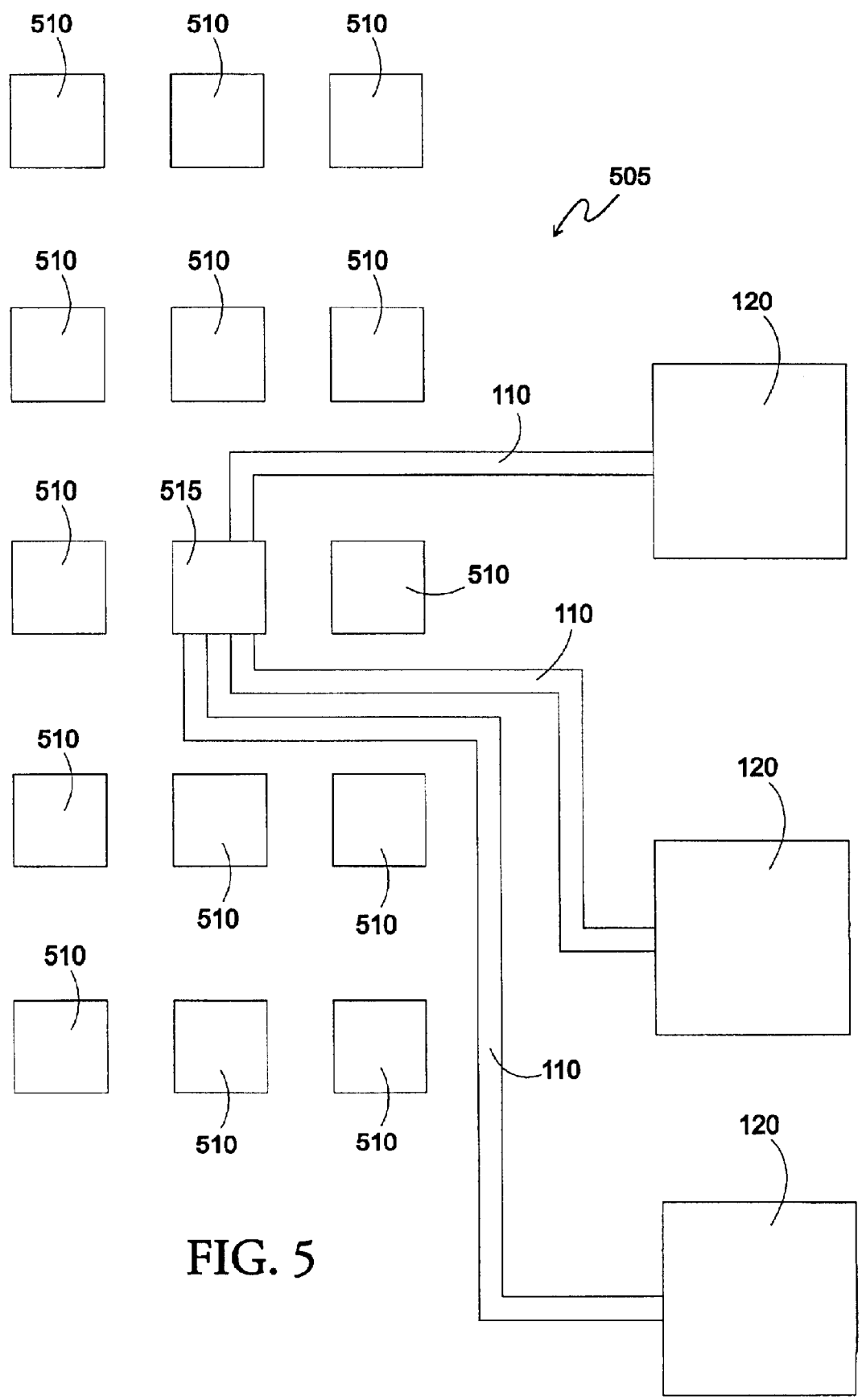
FIG. 5 is a drawing of a group of input/output pads as described in various representative embodiments consistent with the teachings of the invention.

FIG. 5 is a drawing of a group 505 of input/output pads 510 as described in various representative embodiments consistent with the teachings of the invention. Related input/output pads 510 as, for example, those pads associated with a common bus are preferably grouped together as shown in FIG. 5. Among these pads, a special input/output pad 515 can be placed which is used for compensation for processing, voltage, and temperature. Each of these three variables can have an affect on the output of any given input/output pad 510. For example, if the supply potential $V_S$ varies, so does the turn-on impedances of the pull-up transistors 305 and the pull-down transistors 325. Processing variations and temperature can have a similar effect. In this representative embodiment, the above output impedance matching is performed for a selected number of standard lengths of traces, as shown by the three traces 110 connecting the special input/output pad 515, referred to herein as processing-voltage-temperature input/output test pad 515 and also as compensation circuit 515. In a representative embodiment, the compensation circuit 515 comprises the matched resistors $R_M$, the comparator 210, pull-up/pull-down transistors 305,325, and the control circuit 350 of FIGS. 3A and 3B. An instruction is then sent to each of the input/output pads 510 which are based upon the trace 110 length for that input/output pad 510 and the above matching procedure, to select the correct pull-up transistor 305 and pull-down transistor 325 combinations to match the output impedance $R_O$ to the load impedance $R_L$ for each input/output pad 510 in the group 505. The instruction comprises a code which identifies the pull-up or pull-down transistor 305,325 combination to turn on. The above procedures are preferably repeated for each group 505 of input/output pads 510 on the chip 100.

In another embodiment, all compensation codes are derived from impedance matching at one input/output pad. Since all trace lengths are known via the design of the chip, once a compensation is determined, for example, for one process-voltage-temperature input/output test pad 515 and one related trace 110 length, appropriately scaled compensation can be computed for each of the other input/output pads 510 in all of the groups 505 on the chip 100. For this embodiment, only two off-chip precision load resistors $R_{PU}$, $R_{PD}$ are required for the full chip 100, whereas two off-chip precision load resistors $R_{PU}$, $R_{PD}$ are required for each group 505 in the previous embodiment discussed above.

In the above embodiments, other drivers 200 connected to additional conducting traces 110 are referred to herein as additional drivers 201.

The impedance matching process can be on-going to compensate for time dependent changes, as for example temperature and supply voltage, with results then being transferred to the other input/output pads 510 periodically which could be, for example, every 1000 clock cycles.

While the term resistance has been used with respect to the embodiments disclosed herein and resistors have been shown in the drawings and discussed therewith, it will be understood by one of ordinary skill in the art that complex impedances could be used in other embodiments. Also, while discussion has centered around the differences in trace length, as noted above the resistances of the conducting traces 110,140,170 are expressed by $(\rho*l)/(w*h)$, where $\rho$ is the resistivity of the conducting layer and where l, w, and h are respectively the length, width, and height of the conducting traces. Thus, differences in conducting trace 110, 140,170 impedances for a given metal layer in an integrated circuit are dependent upon not only the length of their traces 110,140,170 but also their widths, and to a lessor degree resistivity and trace 110 thickness variations across the chip. The ratio of trace length to trace width forms a parameter of comparison between different traces.

A primary advantage of the embodiment as described in the present patent document over prior techniques is the ability to compensate for trace differences even after the chip 100 has been processed. Thus, trace differences between input/output pads 510 and interconnect areas 120 can be compensated for in conjunction with compensation for package interconnect resistance and for processing, voltage, and temperature variations.

While the present invention has been described in detail in relation to preferred embodiments thereof, the described embodiments have been presented by way of example and not by way of limitation. It will be understood by those skilled in the art that various changes maybe made in the form and details of the described embodiments resulting in equivalent embodiments that remain within the scope of the appended claims.

What is claimed is:

1. A method for matching output impedance of a driver to a load impedance, comprising:

attaching an external impedance between an external contact and a first source potential, wherein the load impedance comprises the external impedance plus impedance of interconnections between an output terminal of the driver and the external impedance;

attaching an adjustable impedance between a second source potential and the output terminal of the driver;

obtaining a reference potential, wherein the reference potential has a value half-way between the first source potential and the second source potential;

obtaining a load matching impedance by changing the adjustable impedance until the absolute value of the difference between voltage of the output terminal of the driver and the reference potential is less than a preselected value;

repeating the method obtaining the load matching impedance for a preselected number of conducting traces, wherein the conducting traces have different length to width ratios;

based on the conducting trace length to width ratio of an additional driver, selecting the load matching impedance which provides the closest match of the output impedance to the load impedance for the additional driver; and transferring an instruction to the additional driver to set the load matching impedance of the additional driver to the result of the method step of selecting the load matching impedance.

2. The method as recited in claim 1, wherein the method step of obtaining the adjustable impedance is performed via a compensation circuit, wherein the compensation circuit is capable of performing the method step of obtaining the adjustable impedance for the preselected conducting traces.

3. The method as recited in claim 1, wherein the adjustable impedance for at least one of the drivers comprises a plurality of field effect transistors, wherein the field effect transistors have capability of being individually turned on and turned off.

4. A method for matching output impedance of a driver to a load impedance, comprising:

attaching an external impedance between an external contact and a first source potential, wherein the load impedance comprises the external impedance plus impedance of interconnections between an output terminal of the driver and the external impedance;

attaching an adjustable impedance between a second source potential and the output terminal of the driver;

obtaining a reference potential, wherein the reference potential has a value half-way between the first source potential and the second source potential;

obtaining a load matching impedance by changing the adjustable impedance until the absolute value of the difference between voltage of the output terminal of the driver and the reference potential is less than a preselected value;

based on the conducting trace length to width ratio of the driver and on the conducting trace length to width ratio of an additional driver, computing the load matching impedance which provides the closest match of the output impedance to the load impedance for the additional driver; and transferring an instruction to the additional driver to set the load matching impedance of the additional driver to the result of the method step of computing the load matching impedance.

5. The method as recited in claim 4, wherein the method step of obtaining the adjustable impedance is performed via a compensation circuit, wherein the compensation circuit is capable of performing the method step of obtaining the adjustable impedance for the preselected conducting traces.

6. The method as recited in claim 4, wherein the adjustable impedance for at least one of the drivers comprises a plurality of field effect transistors, wherein the field effect transistors have capability of being individually turned on and turned off.

7. An electronic circuit for matching output impedance of a driver to a load impedance, comprising:

an external impedance attached between an external contact and a first source potential, wherein the load impedance comprises the external impedance plus impedance of interconnections between an output terminal of the driver and the external impedance;

an adjustable impedance attached between a second source potential and the output terminal of the driver;

a reference potential source, wherein the reference potential obtained from the reference potential source has a value substantially half-way between the first source potential and the second source potential and wherein a load matching impedance is obtainable by changing the adjustable impedance until the absolute value of the difference between voltage of the output terminal of the driver and the reference potential is less than a preselected value; and a compensation circuit, wherein the compensation circuit comprises a comparator having a first input, a second input, and an output, wherein the compensation circuit comprises a control circuit, wherein the first input of the comparator is connected to the output terminal of the driver and the second input of the comparator is connected to the reference potential source, wherein the output of the comparator is attached to an input of the control circuit, wherein, for a plurality of conducting traces having different length to width ratios, the control circuit is capable of changing the adjustable impedance until the absolute value of the difference between the potential of the output terminal of the driver and the reference potential is less than a preselected value, wherein the compensation circuit is connected to at least one additional driver, wherein the compensation circuit is capable of selecting the adjustable impedance which provides the closest match of the output impedance of the additional driver to the load impedance for the additional driver based on the conducting trace length to width ratio of the additional driver, and wherein the compensation circuit is capable of instructing the additional driver to set the load matching impedance of the additional driver to the value of the selected adjustable impedance.

8. An electronic circuit for matching output impedance of a driver to a load impedance, comprising:

an external impedance attached between an external contact and a first source potential, wherein the load impedance comprises the external impedance plus impedance of interconnections between an output terminal of the driver and the external impedance;

an adjustable impedance attached between a second source potential and the output terminal of the driver;

a reference potential source, wherein the reference potential obtained from the reference potential source has a value substantially half-way between the first source potential and the second source potential and wherein a load matching impedance is obtainable by changing the adjustable impedance until the absolute value of the difference between voltage of the output terminal of the driver and the reference potential is less than a preselected value; and a compensation circuit, wherein the compensation circuit comprises a comparator having a first input, a second input, and an output, wherein the compensation circuit comprises a control circuit, wherein the first input of the comparator is connected to the output terminal of the driver and the second input of the comparator is connected to the reference potential source, wherein the output of the comparator is attached to an input of the control circuit, wherein, for a conducting trace having a known length to width ratio, the control circuit is capable of changing the adjustable impedance until the absolute value of the difference between the potential of the output terminal of the driver and the reference potential is less than a preselected value, wherein the compensation circuit is connected to at least one additional driver, wherein the compensation circuit is capable of computing the adjustable impedance which provides a match of the output impedance of the additional driver to the load impedance for the additional driver based on the conducting trace length to width ratio of the additional driver, and wherein the compensation circuit is capable of instructing the additional driver to set the load matching impedance of the additional driver to the value of the selected adjustable impedance.

* * * * *